United States Patent [19]
Doggett

[11] 3,949,142
[45] Apr. 6, 1976

[54] DRY PLANOGRAPHIC PLATE

[75] Inventor: Towers Doggett, Westbrook, Maine

[73] Assignee: Scott Paper Company, Philadelphia, Pa.

[22] Filed: July 31, 1973

[21] Appl. No.: 384,342

Related U.S. Application Data

[60] Continuation of Ser. No. 145,223, May 20, 1971, abandoned, which is a division of Ser. No. 849,800, Aug. 12, 1969, Pat. No. 3,606,922.

[52] U.S. Cl. ............... 428/411; 96/33; 96/36.3; 96/75; 101/450; 101/456; 101/457; 101/460; 101/466; 428/195; 428/210; 428/211; 428/447
[51] Int. Cl.² .. B32B 25/20; B41N 1/00; B41N 1/12
[58] Field of Search.................. 161/266, 207, 209; 101/450, 457, 456, 460, 466; 96/33, 75, 85, 86, 36.3; 428/411, 447, 195, 210, 211

[56] References Cited
UNITED STATES PATENTS

| | | |
|---|---|---|
| 2,937,085 | 5/1960 | Seven et al. ............... 96/75 X |
| 3,136,637 | 6/1974 | Larson .................................. 96/33 |
| 3,211,553 | 10/1965 | Ito ..................................... 96/33 X |
| 3,511,178 | 5/1970 | Curtin .............................. 101/450 |
| 3,652,273 | 3/1972 | Htoo ............................... 96/36.3 |
| 3,671,236 | 6/1972 | Van Beusekom .................. 96/75 X |
| 3,677,178 | 7/1972 | Gipe ............................. 96/36.3 X |

Primary Examiner—Marion E. McCamish
Attorney, Agent, or Firm—John A. Weygandt; John W. Kane

[57] ABSTRACT

A new dry planographic plate having a non-ink receptive silicone rubber background area that does not require a fountain solution to repel printing ink and process of producing this new plate comprising applying the photoresponsive sensitizer to a polymeric support film and bringing the sensitizer layer into intimate adhesive contact with an uncured silicone gum and thereafter curing the silicone gum.

11 Claims, 3 Drawing Figures

INVENTOR
TOWERS DOGGETT

BY

ATTORNEYS

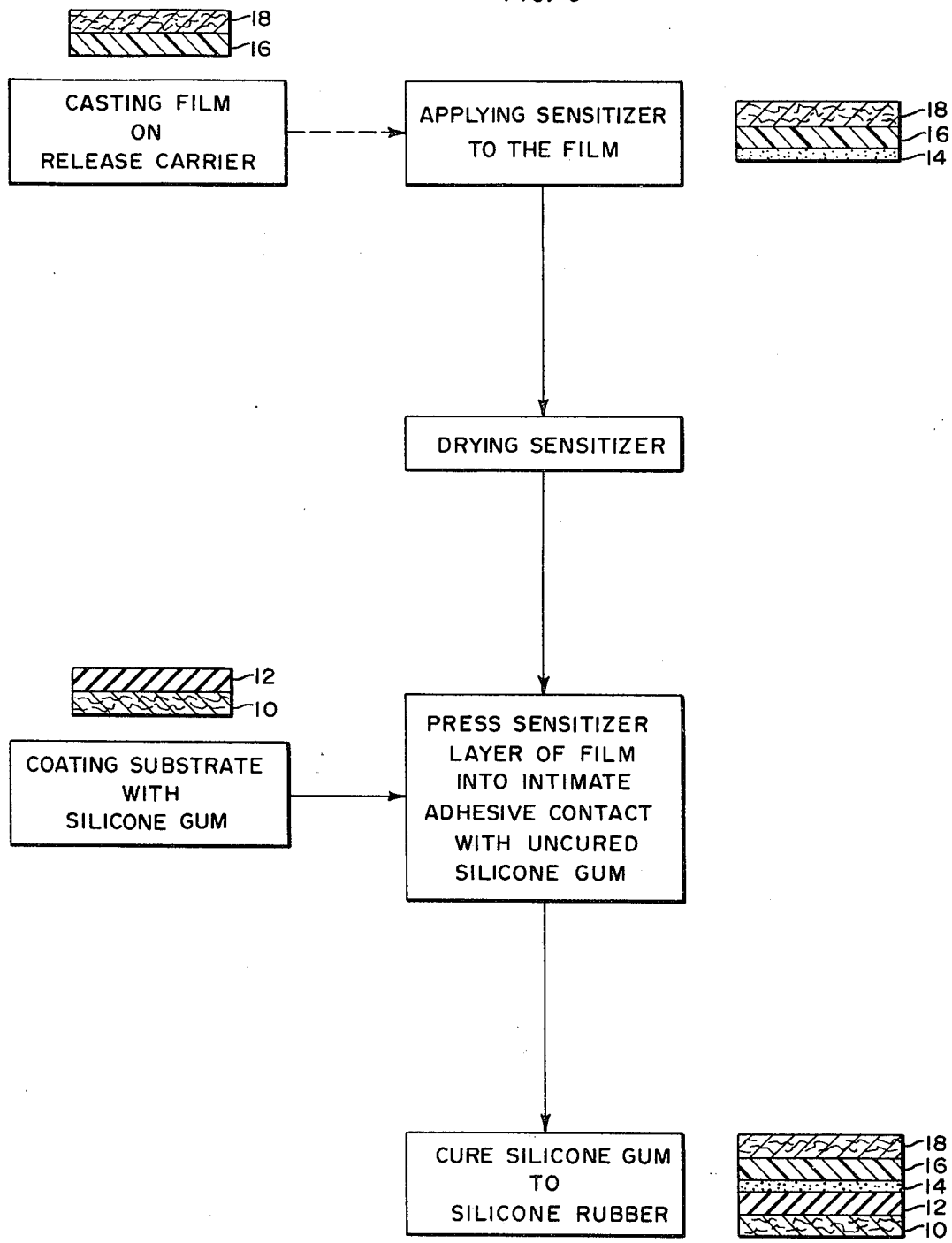

DRY PLANOGRAPHIC PLATE

RELATED APPLICATIONS

This is a continuation of application Ser. No. 145,223 filed May 20, 1971, now abandoned, which in turn is a division of U.S. Pat. Application, Ser. No. 849,800, filed Aug. 12, 1969 now U.S. Pat. No. 3,606,922 granted Sept. 21, 1971.

BACKGROUND OF THE INVENTION

This invention relates to a form of dry planography which might be referred to as "silicone rubber planography". More particularly, it relates to methods of making new pre-sensitized plates usable in such dry planography, developing them for use on a dry planographic offset or direct printing press and the new plates themselves.

Dry silicone rubber planography is an improvement or a simpliciation of conventional offset lithography. In conventional offset lithography an aqueous fountain solution is applied to the background area of the printing plate. This fountain solution wets the hydrophilic background areas of the plate rendering them non-ink receptive. The oleophilic image areas of the plate are not wet by the aqueous fountain solution and are, therefore, inked by the inking rollers. The ink on the image is next printed upon a rubber blanket from which it is "offset" or transferred to the final printing substrate usually a sheet of paper. The process is repeated for each of as many prints as are desired. Lithography gives excellent results; but the process requires complex printing presses as well as a considerably degree of expertise in their operation. One of the major problems encountered during lithographic printing is caused by the fountain solution which must be carefully controlled; too little fountain solution causes the background areas to tone and too much causes emulsification of the ink. Elimination of the fountain solution would decrease the amount of skill required to operate the presses as well as allowing the press design to be simplified considerably. The present invention is directed to a presensitized lithographic plate that eliminates the fountain solution and to a method of producing that plate.

The most common method of presensitizing photolithographic printing plates is to wash the surface of the plate with an aqueous solution of diazonium salt which, upon drying, leaves a thin layer of the diazonium compound on the surface of the plate. When exposed to actinic light through a negative transparency, the diazonium compound in the exposed image areas is converted to an aqueous insoluble oleophilic compound which adheres to the surface of the plate while the unexposed diazo remains soluble. Subsequent washing of the exposed plate with an aqueous developer solution removes the unexposed and still soluble diazo compound from the background areas, but leaves the insoluble oleophilic image firmly attached. The image thus produced accepts ink from the inking rollers.

In dry or silicone planography, the background areas of the plate are cured elastic silicone rubber which when dry without being wetted by water or other liquid, will not accept printing ink from a rotating printing roller passed thereover.

French Pat. No. 1,475,466 discloses an excellent diazo-sensitized plate capable of being imaged by exposure to light through a positive transparency. In this case the diazo image forming compound lies beneath the silicone rubber layer. In the exposed background areas the diazo compound becomes insoluble, while in the non-exposed image areas it remains soluble. When the exposed plate is developed by scrubbing with developer solution the still soluble diazo in the image area is loosened and removed along with the silicone rubber overlaying that area. Considerable attention to detail is required in removing the cured silicone rubber to lay bare the underlying ink-receptive image area, but when carefully done an excellent long-run plate results. The removal of cured silicone rubber is usually difficult, particularly when the film is more than a fraction of a mil in thickness and the use of films thicker than a fraction of a mil is generally desired. In many cases it would be preferably to use a thicker film of silicone if it were not so difficult to remove the silicone rubber in the image areas; for some reason not now apparent, thicker silicone rubber layers seem less prone than very thin layers to becoming "toned-" by repeated passage of an inking roller thereover. It is, therefore, desirable to produce a master which does not require the use of an undesirably thin layer of silicone rubber.

In addition, it is desirable to produce a presensitized plate where the image is firmly bonded to the silicone but the plate can be developed without removing portions of silicone or otherwise damaging the surface of the silicone layer. Production of such a master or plate entails affixing an ink-receptive image to the silicone surface. This is very difficult to accomplish, however, because the very properties of the silicone rubber which prevent ink from adhering to its surface also act to prevent the imaging material from firmly adhering to the surface of the silicone material. Thus, the procedures previously utilized to sensitize lithographic printing plates are not suitable for sensitizing the silicone rubber coated dry planographic plates. It has been found that neither aqueous solutions of diazonium sensitizers nor solutions in the usual organic solvents adhere as well as desired to the surface of silicone rubber for the silicone is not wet by such solutions and the sensitizer materials do not adhere to the silicone rubber.

It is possible to sensitize a dry silicone rubber surface as disclosed by Harry F. Gipe in pending U.S. Patent Application Ser. No. 706,286, filed Feb. 19, 1968 now U.S. Pat. No. 3,677,178, by rubbing dry powdered water-soluble diazonium salt into the silicone rubber surface. The plate so prepared can be exposed through an image bearing transparency and washed with water to remove the unexposed diazo compound in the background areas leaving the exposed reacted diazo material in the image areas. The exposed image areas accept printing ink and readily transfer the ink to the printing surface. Under the best conditions, however, only a few hundred copies can be printed before the image fails. Furthermore, such a method does not lend itself to modern high speed mass production methods; therefore, even for short run plates the method is not economically advantageous. The method of the present invention is directed to a method of applying the photo-responsive sensitizer material which results not only in good adhesion between the photo-responsive material and the silicone rubber background area but this method also lends itself to use in modern high speed production facilities. Furthermore, since developing the plate of the present invention does not entail removing part of the silicone layer, the silicone layer can be as thick as desired without adversely affecting developing characteristics or plate life.

DESCRIPTION OF THE DRAWINGS

FIG. 3 is a block diagram depicting the steps of the present process. A cross section of the article following each operation is also shown.

GENERAL DESCRIPTION OF THE INVENTION

Figure 4:
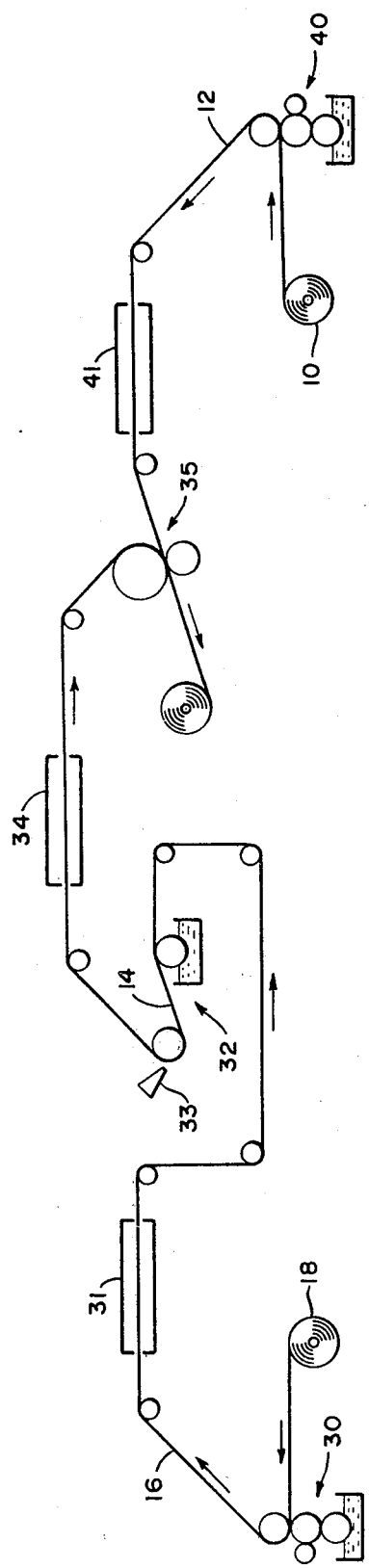
FIG. 4 is a diagrammatic view of a continuous process for producing the plate of the present invention.
Figure 2:
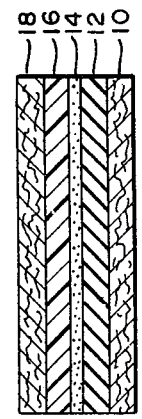
FIG. 2 is a diagrammatic view in cross section of a second embodiment of the present invention.

According to the present invention, there is produced a new presensitized silicone rubber planographic plate comprising a substrate coated on at least one surface with a cured silicone rubber layer which will not remove ink from printing rollers, a photoresponsive sensitizer overlayer and an ink receptive transparent polymeric film. Essentially, the new plate is produced by applying a thin layer of a photoresponsive sensitizer to the surface of a transparent polymeric support film, drying the sensitizer, and then laminating the sensitizer bearing polymeric film to a silicone gum coated substrate with the sensitizer being brought into adhesive contact with the surface of the silicone gum while the latter is still uncured, and thereafter curing the silicone gum to form silicone rubber while the sensitizer is in contact therewith. The photoresponsive sensitizer layer and supporting film are thus sufficiently bonded to the silicone layer that they are not easily stripped from the silicone.

The new presensitized plate of the present invention is readied for use (exposed and developed) in the lithographic process by exposing the plate to actinic light through a negative transparency which results in the insolubilization of the sensitizer in the exposed image areas and the formation of a strong bond between the exposed sensitizer and both the overlying polymeric film and the underlying silicone. The exact nature of the increased bonding between the exposed diazo sensitizer and the silicone rubber and polymeric film is not fully understood; however, the diazo sensitizer adheres more strongly to the silicone rubber and the polymeric film after it has been insolubilized by exposure to actinic radiation than it does prior to exposure. The silicone rubber apparently also strikes through the sensitizer layer and adheres slightly to the polymeric film. Upon exposure of the sensitizer, the adhesion between the silicone and the polymeric film appears to be increased thereby forming an image area which is not removed during development, while the film and sensitizer in the unexposed areas can be washed away by the developer solution.

Following exposure, the plate is developed using an aqueous developer solution; such developer solutions are well known in the art and are usually comprised of water and lower alkanol or a water miscible organic solvent such as acetone, etc. The developing procedure removes the film and sensitizer layer from the unexposed background areas and bares the non-ink receptive cured silicone layer. The exposed areas of sensitizer and the overlying polymeric film are not removed and these areas form the ink receptive printing surfaces. Thus a plate is produced for planographic printing wherein the image areas while the silicone rubber background areas pick up and transfer ink remain ink free without the use of fountain solutions.

The new dry planographic plate and method of producing the plate can be readily understood by reference to FIGS. 1-4.

Figure 1:
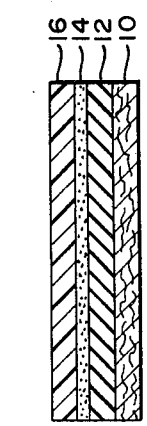
FIG. 1 is a diagrammatic view in cross section of the new planographic plate of the present invention.

FIG. 1 is a diagrammatic view in cross-section of a new planographic plate comprising a substrate material 10 coated with a layer 12 of cured elastic silicone rubber. In intimate adhesive contact with the cured silicone rubber layer 12 is a layer 14 of photoresponsive, image-forming sensitizer material which overlies layer 12 and is adherent to a transparent polymeric film 16. The polymeric film 16 serves as a substrate and support layer for the sensitizer layer 14. In the preferred embodiment shown in FIG. 2, the polymeric film is in releasable contact with a release carrier 18 which can be easily stripped from the polymeric film 16 at any time between the production of the plate and exposure of the plate.

With reference to FIG. 3, the block-flow diagram illustrates the method employed to produce the new dry planographic plate compristing coating at least one side of polymeric film 16 with a photoresponsive sensitizer layer 14. In the preferred embodiment, the polymeric film 16 is carried on the release surface of an easy release carrier 18, with the polymeric film remaining in contact with the release carrier at least until the sensitizer layer is brought into adhesive contact with the silicone layer. The polymeric film is cast directly on the surface of the release carrier by procedures well known to the skilled in the art. While the use of a release carrier is not necessary, it is preferred as it allows a thinner polymeric film to be employed as the substrate for the sensitizer layer than could be employed without the use of release carrier.

In applying the sensitizer 14 to the polymeric film 16, the sensitizer is generally suspended in a liquid carrier which may or may not be a solvent for the sensitizer and the sensitizersolvent mixture or solution is applied to the polymeric film by any convenient means such as a reverse roll coater, air knife, sprayer, dip tank, or other coating means. The carrier is then dried to evaporate the liquid carrier and leave the sensitizer as a thin layer. Once dried, the sensitizer layer 14 is brought into intimate contact with the uncured silicone gum layer 12.

The uncured silicone surface to which the sensitizer is applied is prepared by applying a layer of silicone gum 12 to at least one surface of a substrate 10. The silicone gum is applied by any convenient means including blade coaters, Mayer bar coaters roll coaters, sprayers, and the like. The silicone gum must be adhesively bonded to the surface of the substrate in order not to delaminate during the stresses encountered during the printing process. Generally, a separated adhesive is not needed to bond the silicone to the substrate as the silicone gums are usually strong adhesives. However, a separate adhesive material can be employed if the particular silicone gum is not sufficiently adhesive to bond to the substrate. The sensitizer 14 can be brought into adhesive contact with the silicone gum immediately after the application of the silicone gum to the substrate. However, when the slicone gum contains a solvent it is preferred that at least a substantial portion of the solvent be evaporated before the sensitizer is brought into contact with the silicone layer. Removal of the solvent increases adhesion between the sensitizer layer and the silicone and prevents the solvent from damaging the polymeric film. The solvent is evaporated if necessary by heating the silicone briefly by such convenient means as infrared, heated air, etc. Care must be taken, however, not to cure the silicone at this time, prior to the application of the sensitizer; therefore, the evaporation of solvents should be carried out quickly. If the silicone gum becomes cured before being brought into contact with the sensitizer, the sensitizer will not adhere to the silicone. After the silicone layer and the sensitizer layer are pressed into adhesive contact, the silicone gum layer is alowed to cure. The manner in which the silicone gum is cured will depend upon the particular silicone gum being employed. Many of the silicone gums will cure at room temperature with the passage of time and exposure to moisture; in such cases active curing procedures such as heating are not required. Even through many of the gums cure at room temperature, heat often can be utilized to enhance curing or is used to cure those silicone gums which do not cure at room temperature. When heat is used to cure the silicone layer or to enchance curing, care should be taken to maintain the temperature below the temperature at which the sensitizer becomes decomposed or otherwise adversely affected and below temperatures at which the polymeric film melts or becomes softened. The curing step of the method of the present invention encompasses those cases where the silicone gum is merely allowed to cure under ambient conditions such as at room temperature as well as those cases where active curing steps such as heating are employed.

While the new plates can be fabricated individually, in a preferred procedure, the plates are manufactured in a substantially continuous process as graphically depicted by FIG. 4 wherein the polymeric material used to produce the flexible transparent polymeric film 16 is applied to the release carrier 18 by coating means 30 and dried in dryer 31. Drying or curing of the polymeric film 16 is accomplished by known means such as forced air, heated or unheated, infrared, irradiation and the like. Following the drying procedure, the sensitizer layer 14 is applied to the film 16 by coating means 32, excess sensitizer is removed by air knife 33 and the sensitizer layer dried in dryer 34. The sensitizer layer 14 will have to be dried in a manner so as not to activate the photoresponsive sensitizer and at temperatures which will not have a deleterious effect on the sensitizer. Means of so drying sensitizers such as by forced air, heated or unheated, and under non-activating conditions, are well known to those skilled in the production of lithographic plates.

The substrate-uncured silicone gum composite is prepared by applying the silicone gum to the substrate by coating means 40 and thereafter removing the solvent from the silicone gum by drying means 41 without curing the silicone gum. The uncured silicone material will adhere strongly to the substrate 10, and, when cured, is bonded strongly enough to withstand delamination during the subsequent fabrication procedures and the printing cycle. Following the evaporation of the solvent from the silicone gum, the sensitizer layer 14 is pressed into contact with the uncured silicone gum by opposed rolls 35. The silicone gum is then allowed to cure. The plate material can be wound on a roll and allowed to cure before being cut into individual plates or the continuous web can be cut into individual plates immediately and allowed to cure as individual plates.

Once the silicone gum has been cured the release carrier can then be stripped from the polymeric film. Actually, the release carrier can be stripped at any time following the joining of the sensitizer and silicone layers provided the adhesion between the sensitizer and silicone is greater than the adhesion between the polymeric film and the release carrier. In a preferred procedure, the release carrier sheet is left in place during the production and shipping procedures to provide protection to the surface of the plate, with the release carrier being removed just prior to exposure of the plate.

In the present specification and claims, the term "sensitizer" generally refers to the diazonium type photosensitizers. The diazonium sensitizers useful in the present invention are generally water-soluble negative acting or water-insoluble positive acting with the water soluble negative acting diazonium photoresponsive being preferred. The most commonly employed water soluble sensitizers are the aldehyde condensation products of double salts of zinc and para-diazodiphenylamine. Other representative diazonium photosensitizers are disclosed in U.S. Pat. No. 2,649,373. The diazo sensitizer is generally dissolved in an inert liquid carrier, such as water or a water-lower alkanol mixture. Other solvents can be employed such as methyl cellosolve, methyl isobutyl ketone, methyl ethyl ketone, acetone or ethyl acetate with care being taken to select a solvent that will not dissolve the underlying support film. The sensitizer solution or suspension is then coated on the film by conventional means such as air knife, Mayer bar or reverse roll coater. The sensitizer coating is then dried at room temperature or at elevated temperatures that do not have any deleterious effect on the sensitizer. In general, the diazo sensitizers withstand temperatures up to about 70°C for a few hours.

The term "polymeric film" as employed in the present specification and claims refers to a polymeric film that is ink receptive and solvent softenable and transmits actinic light, thus enabling the sensitizer to be exposed. The polymeric film functions most importantly as a support and carrier for the sensitizer. The unexposed sensitizer is not coherent enough to form an unsupported layer. The polymeric film can be unsupported or supported by a release carrier web provided the release surface has less adhesion for the film than the film has for the sensitizer layer. The thickness of the polymeric film to be employed is not critical with films having a thickness of from 0.01 to 0.5 mil being suitable. Preferably, however, the film has a thickness of between 0.02 and 0.10 mil. In most cases such preferred polymeric films will not be strong enough to be self-supporting and thus will have to be employed in conjunction with a release carrier. The film to be employed in the production of a particular plate will advantageously be selected with regard to the specific photo-responsive sensitizer employed so as to obtain good adhesion between the film and the imaged sensitizer. The polymeric film must be permeable to the developing liquid in order that the developing liquid can permeate through the film to dissolve the unexposed diazo sensitizer. It is further desirable that the film be solvent softenable, thus facilitating removal of the film overlying the unexposed diazo sensitizer by the developing solution. For these reasons thinner polymeric films, e.g. from 0.02 to 0.10 mils are preferred as they are more easily removed from the unexposed areas and they are generally more permeable. Advantageously, when the sensitizer is a water soluble negative-acting diazonium salt, the preferred polymeric film is one that is not soluble in water and is not softenable by hydrocarbons such as those that may be present in printing inks. Polyvinyl acetate, polyvinyl formal, and polyvinyl butyral are examples of such films and are preferred. These films are penetrable by the water-alcohol mixtures conventionally employed to develop exposed lithographic plates and these films are easily scrubbed away from the unexposed areas along with the underlying soluble diazo sensitizing compounds.

Films which are normally water-soluble but which are tanned to an insoluble condition by diazos under the action of light are also satisfactory. Representative water soluble films include polyacrylamides, polyvinyl methyl methacrylate, polyvinyl pyrrolidone, polyvinyl alcohol and alkyl cellulose ethers such as methyl cellulose, hydroxyethyl cellulose and carboxymethylhydroxyethyl cellulose.

The water soluble film producing polymers can be mixed with a water soluble diazonium salt and the entire composition cast on the surface of a release carrier to produce a water soluble polymeric film containing the diazonium salt. On exposure to actinic light, the exposed film and sensitizer become insolubilized while the unexposed film and sensitizer remain water soluble. The soluble unexposed film and sensitizer are removed with an aqueous developing solution to bare the non-ink receptive silicone rubber background areas leaving the insoluble ink receptive image areas as the printing surface. Solvent softenable but water insoluble films as employed in the present invention include polyvinyl butyral, polyvinyl formal, polyvinyl chloride acetate, polyvinyl acetate, epoxy films, polyesters, and cellulose esters such as cellulose acetate, cellulose propionate and cellulose acetate butyrate. Whether the polymeric film is water soluble or merely permeable to water and solvent softenable, the preferred polymeric films for use in the present invention are those films which react with or are reacted upon by the diazo sensitizer during exposure to actinic radiation thereby forming a stronger bond between the diazo sensitizer and the polymeric film. This strengthening of the bond between the exposed diazo and the polymeric film is not fully understood but is referred to as "tanning".

As previously stated, the film can be self-supporting or non-self-supporting with the non-self-supporting films being borne by a releasible carrier web. The films that are self-supporting can also be employed in conjunction with a release carrier. For use in supporting the sensitized film according to the invention there may be used substantially any releasing carrier from which the sensitized film will separate readily and cleanly. The release surface to be employed will depend upon the composition of the support film. However, carrier webs having suitable releasing surfaces for the various polymeric films are well known and readily obtainable on the market. It is preferred that the carrier shall have a substantially level smooth surface as the smoother release carriers usually result in a smoother polymeric film and thus a smoother, more even printing surface. Melamine, alkyd, stearatochromic chloride, silicone rubber and the release carrier described in U.S. Pat. Application Ser. No. 628,582 are among the many known release surfaces that will carry the sensitizer support film.

The substrate to which the silicone rubber is bonded can be substantially any sheet or web material that has sufficient strength to be used as a printing plate. Representative substrate materials include metal, plastic, paper, foil coated paper, foil coated plastic and the like. It is preferred that the substrate material be flexible enough to be used in planographic presses. The substrates of a weight and strength comparable to those commonly found satisfactory for use as a lithographic printing plate are suitable for use in the present invention. Clean smooth sheet aluminum is the preferred substrate material. The smoother the substrate, the thinner the layer of silicone gum that can be applied thereto and thus smooth plates are preferred.

Silicone rubbers suitable for use in the present invention are well known. Essentially, they are elastomers of high molecular weight about 400,000 to 800,000 formed by slightly cross-linking linear diorganosiloxanes (preferably dimethylsiloxane) and stopped by acyloxy, hydroxyl, or oxime radicals. The cross-linking is usually the result of action by metal carboxylates, and heat if necessary, or moisture. These silicone rubbers are commonly referred to as "silicone elastomers" and are formed by the cure or further polymerization of "silicone gums".

Silicone elastomers, formed by further polymerizing the gums, can be characterized generally as the very sparsely cross-linked cured dimethyl polysiloxanes of high molecular weight, e.g., 400,000 to 800,000 average molecular weight. The sparsity of cross-linking is indicated by R/Si ratios very close to 2, generally above 1.95 or even above 1.99, and generally below 2.1 or even below 2.01, there usually being 200–500 dimethyl units between cross-link sites. In contrast, the much more densely cross-linked silicone resins which have not been found to be useful as a background area are considered commercially useful fall in the range of R/Si ratios of 1.2 to 1.5.

Representative silicone gums include the diorganopolysiloxanes having the central repeating linear

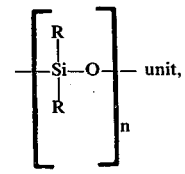

wherein $n$ may be as small as 2 or as large as 20,000 or more, and where R's in the chain may be the same, but need not be, each individual R being a monovalent alkyl or aryl group, halogenated alkyl or aryl group or cyano alkyl group, with not more than a few percent of total R being vinyl, phenyl, or halogenated vinyl or phenyl, the major proportion of R usually being methyl groups.

While an internal R may become a cross-linking site, depending somewhat on the curing mechanism, cross-linking more frequently involves the end groups which may be

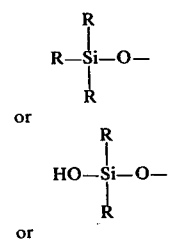

or

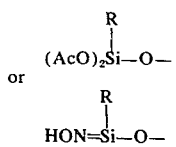

where "R" has the same meaning as above, and where Ac is a saturated aliphatic monoacyl radical.

The polymerizable silicone gums preferably are compounded with catalyst as necessary to promote cure, as generally known, and also with fillers, e.g., silica fillers, to improve mechanical properties. The catalysts employed in the silicone rubber compositions include the organic carboxylic acid salts of tin, zinc, and other multivalent metals and are well known in the art. Available commercial silicone gum compounds generally provide after curing, satisfactory silicone rubber layers which adhere strongly to the substrate and provide good mechanical properties which minimize problems of wear, both in physical handling and under the abrasive conditions on the press. It is not vitally necessary that the elastomer to filled. For example a silicone gum SE-76 (General Electric Company), reported to have an average molecular weight of 400,000 to 500,000, is an example of an unfilled silicone gum which, after curing to an elastomer, provides a satisfactory adhesive surface. Suitable silicone gums which upon curing provide good silicone rubber layers include General Electric's RTV 118, RTV 108, Clear Seal; Dow Corning's Bath Tub Caulk, Silastic 140, Sylguard 186 and Catalyst 186, RTV Dispersion 236 RTV 732, 92-009 Dispersion Coating, XC-20-575, XC-20-576, XC-20-577, XC-20-583, XC-20-586 and XC-20-589. Further, with reference to the silicone elastomers useful in the present invention, we incorporate by reference the disclosure of copending application, U.S. Ser. No. 706,286, filed Feb. 19, 1968.

The minimum useful thickness of silicone is the least quantity which will completely cover the surface of the substrate. Functionallly, there is no real maximum thickness of silicone that is inoperable. Thick films of silicone rubber generally require longer periods of curing than thin ones; however, from a practical viewpoint, it is preferable to limit the film thickness to only a few mils; and if desired, it may be kept below one mil.

DETAILED EXAMPLES

EXAMPLE 1

A carrier web of commercial glossy-finished release coated paper (S.D. Warren Company's Transkote Patent A) was coated by means of a Mayer bar, with a solvent solution of polyvinyl butyral in sufficient quantity to form a dry film 0.0001 inches in thickness. This film was dried and then coated with a 2% solution of the condensation product of the double chloride of zinc and diazotized para-aminodiphenylamine with an equimolecular weight of formaldehyde, the solvent being a 75:25 mixture of water and isopropanol. The coating and drying of the sensitized sheet was carried out under yellow lights.

A sheet of clean 5 mil aluminum was coated by means of a Mayer bar with suffficient high molecular weight linear polysiloxane (General Electric RTV 108) to produce a silicone layer of about 2 mils in thickness. Immediately after the silicone coating was applied to the metal sheet and while it was still tacky, the dried diazo surface of the sensitized film was roll-pressed into firm contact with the uncured silicone coating. The laminate was then rolled up into a roll and allowed to stand overnight to allow the silicone to cure.

After 24 hours a 10 × 15 inch sheet was cut from the laminate. The carrier web was peeled off, and the exposed surface was exposed through a negative to a 35 kva double carbon arc at 35 inches for 30 seconds. The exposed plate was then swabbed with a pledget of cotton wet with a 75:25 mixture of water and isopropanol until the unexposed diazo and overlying polyvinyl butyral film had been removed from the background areas of the plate. The plate was allowed to dry and was then mounted and run as a printing plate on a "Multilith" offset duplicator from which the molleton moistening rollers had been removed. The run was stopped after 5000 copies even though satisfactory copies were still being printed.

EXAMPLE 2

A commercial release-coated paper (S. D. Warren Company's Transkote Patent A) was coated with 1½ grams, dry weight, per square meter, of polyvinyl formal (Monsanto's Formvar 7/70) applied as a 5% solution in acetone. This was dried and then coated with about 100 milligrams per square meter of a formaldehyde condensate of the double chloride of zinc and paradiazo-diphenylamine applied as a 2% solution in a 2 to 1 mixture of water and isopropanol. The diazo coating was applied, and dried below 70°C, under yellow light.

A sheet of clean aluminum was coated with a layer of 15 grams per square meter of RTV silicone rubber (Dow Corning's Silicone Dispersion 236) and while this layer was still wet, it was rolled into adhesive contact with the diazo layer carried by the polyvinyl formal film supported by the release coated carrier web. The sandwich was left to stand overnight at room temperature to allow the silicone rubber to cure. Then the release coated carrier web was peeled off and the uncovered surface was exposed through a negative transparency for 30 seconds to a 35 ampere carbon-arc at a distance of 26 inches. Thereafter the exposed surface was developed by swabbing with a 2 to 1 mixture of water and isopropanol, which removed the polyvinyl formal and undecomposed diazo compound from the unexposed areas, leaving a bare silicone rubber surface in those areas, but leaving as ink-receptive image in the exposed areas. The developed plate was dried and then run as a dry printing plate on a rotary offset duplicator from which the moistening rollers had been removed.

The following examples describe the preparation of additional dry lithographic plates using the procedures described in Example 2. However, the support films, silicone composition and exposure conditions are varied as indicated in the examples. The sensitizer is as described in Example 1 except as otherwise indicated. The medium to long run plates produced in accordance with these examples provide clear satisfactory copies without the use of fountain solutions to wet the background areas of the plate.

EXAMPLE 3

A support film of polyvinyl acetate (Union Carbide's AYAA) is applied to a release coated carrier as a 10% solution in a 9 to 1 mixture of isopropanol and water in an amount sufficient to provide 3 grams per square meter, dry weight, of polyvinyl acetate.

The silicone rubber layer, 21 grams per square meter, dry weight, Dow Corning's RTV silicone composition XC-20-577, was applied to the surface of an aluminum sheet in an amount sufficient to provide 21 grams of silicone rubber per square meter, dry weight. The plate was exposed for 40 seconds and developed with a 1 to 5 mixture of isopropanol and water.

EXAMPLE 4

A film comprised of vinyl acetate/crotonic acid copolymer (Monsanto's Gelva C3V20) was applied as a 10% solution in a mixture of equal parts of isopropanol and toluene in an amount sufficient to provide 4.2 grams, dry weight, of film per square meter.

Dow Corning's Silastic RTV-732 was applied to the aluminum substrate in an amount sufficient to provide 30 grams, dry weight, per square meter. The plate was exposed for 40 seconds and developed with a 1 to 4 mixture of isopropanol and water.

EXAMPLE 5

A film of polyvinyl-pyrrolidone (General Aniline and Film's K30) was applied to the release carrier as a 10% solution in isopropanol in an amount sufficient to provide 2.4 grams, dry weight, per square meter. 21 grams per square meter, dry weight, of General Electric's RTV 118 was applied to the aluminum substrate. The plate was exposed for 60 seconds and developed with toluene.

EXAMPLE 6

A film, 4.5 grams, dry weight, per square meter, of polyvinyl alcohol (Air Reduction's Vinol 125) was applied to the release carrier from a 10% solution in water.

The sensitizing layer consisted of a mixture of about 100 milligrams of the formaldehyde condensate of the double chloride of zinc and para-diazodiphenylamine and 100 milligram of acrylic acid, per square meter, deposited from a water solution containing 2% of each of the two said ingredients.

The silicone rubber layer was Dow Corning's RTV silicone XC-20-577 (18 grams per square meter).

The plate was exposed for 60 seconds and developed with a mixture of equal parts of isopropanol and water.

EXAMPLE 7

Polyvinyl butyral (Monsanto's Butvar 76) was applied to the release carrier as a 5% solution in isopropanol in an amount sufficient to provide a film of 2 grams dry weight per square meter.

The sensitizer was a sulfonated condensation product of formaldehyde and the double chloride of zinc and para-diazodiphenylamine amounting to about 0.1 grams, dry weight, per square meter deposited from a 2% solution which contained about 2% of the wetting agent, Union Carbide's Tergitol TMN said to be trimethylnonyl ether of polyethylene glycol.

General Electric's RTV 108 was applied to the aluminum substrate in an amount sufficient to provide 20 grams dry weight per square meter.

The plate was exposed for 30 seconds and developed with a 2 to 1 mixture of water and isopropanol.

EXAMPLE 8

Ethyl cellulose (Dow Chemical Company's Ethocel, 20 cps) was applied to the release carrier as a 2.5% solution in a 9 to 1 mixture of isopropanol and water in an amount sufficient to provide 2.25 grams, dry weight, per square meter. Dow Corning's RTV silicone XC-20-577 was applied to the aluminum substrate in an amount sufficient to provide 21 grams of silicone, dry weight, per square meter.

The plate was exposed for 40 seconds and developed with a mixture of equal parts of water and isopropanol. The development removed the ethocel from the image areas as well as from the background areas, and at the end of that run the image areas were all still firmly attached and were printing clear clean images.

EXAMPLE 9

An unsupported film of polyvinyl butyral weighing 23 grams, dry weight, per square meter, was prepared. This dried unsuppoted film was coated with sensitizer, dried, applied to a silicone rubber coated substrate image and developed using the materials and methods described in Example 2.

EXAMPLE 10

In another procedure, Dow Corning's RTV 732 was coated on 5 pt. aluminum sheet. The condensation product of the zinc chloride and diazotized p-aminodiphenylamine with formaldehyde (2%), polyvinyl alcohol (2%), Tergitol, TMN (0.2%) and water (95.8%) were blended together and the resultant mixture coated on S. D. Warren Company's release carrier Transkote Patent A. The sensitizer layer was dried and laminated to the Dow Corning's RTV 732-aluminum composite. The silicone gum was allowed to cure overnight and release carrier removed. The plate was exposed through a negative transparency for 3 minutes and developed with water-isopropanol. The medium run plate thus produced gave clear copies using a Multilith 1250 offset duplicator and ML 36 ink produced by Addressograph-Multigraph.

EXAMPLE 11

A solution of polymeric film-forming resin having the following composition was made:

|  | Parts by Wt. |
|---|---|
| Formvar 12/85 (a polyvinyl formal sold by Monsanto) | 20 |
| Diacetone alcohol | 50 |
| Butanol | 50 |
| Ethanol | 50 |
| Xylol | 100 |
| Monastral Blue (duPont), a colored pigment | 5 |

This solution was applied by means of a No. 12 Mayer bar to a glossy release-coated paper (S. D. Warren Company's Transkote Patent A) and the coated papers was dried for ½ minute by a current of hot air at 200°F.

The dried sheet was further coated by means of a No. 6 Mayer bar with a sensitizing solution of the following composition:

|  | Parts by Wt. |
|---|---|
| Aldehyde condensate of the double chloride of zinc and diazotized para-aminodiphenylamine | 1 |
| Water | 100 |
| Isopropanol | 50 |

The so-coated sheet was dried for ½ minute in a current of warm air at 150°F.

A sheet of clean 5 mil aluminum was coated by means of a No. 26 Mayer bar with a layer of Dow Corning's Silicone Gum No. XC-20-577 which had been thinned with an equal weight of toluene. The so-coated sheet was then force-dried for one minute by air having a temperature of 250°F to remove the toluene. The still sticky surface of the silicone gum was then firmly roll-pressed into contact with the diazo sensitizer layer supported by the polyvinyl formal polymeric film carried by the Transkote release carrier.

The laminate so produced was allowed to age for 24 hours at ambient room temperature and humidity to allow the silicone gum time to cure into silicone rubber.

After the period of cure, the release coated carrier web was peeled away from the sheet and discarded, leaving the polyvinyl formal layer open to view. The sensitized sheet was then exposed for 30 seconds through a negative transparency to the action of a 35 kva double carbon arc at a distance of 35 inches. The exposed plate was then rubbed with a cotton swab wet with a 50:50 mixture of water and isopropanol to remove the unexposed diazo and overlying polyvinyl formal film from the background or unimaged positions of the plate.

The plate was then completely dried and mounted on the plate cylinder of a No. 1250 "Multilith" offset duplicator from which the moistening rollers had been removed. The dry plate was run on the dry press using Addressograph-Multigraph's ML 36 lithographic ink. Over 10,000 satisfactory copies were printed.

I claim:

1. A dry planographic printing plate comprising a substrate, and at least three additional layers disposed in superimposed relation to each other:
   1. a silicone rubber layer adhesively bonded to at least one surface of the substrate,
   2. a photoresponsive sensitizer layer adhesively bonded to the silicone rubber layer, said adhesive bond being formed by curing a layer of silicone gum while it is in physical contact with said substrate and sensitizer layer; and
   3. overlying the sensitizer layer, a polymeric film permeable to the liquid used to develop the exposed plate.

2. The plate according to claim 1 wherein the photoresponsive sensitizer is a diazo sensitizer.

3. The plate according to claim 2 wherein the diazo sensitizer is water soluble when unexposed and becomes water insoluble when exposed to actinic radiation.

4. The plate according to claim 3 wherein the polymeric film is reacted upon by the exposed photoresponsive diazo sensitizer and thus becomes firmly bonded to the sensitizer in the exposed image areas.

5. The plate according to claim 2 wherein the diazo sensitizer is water insoluble when unexposed and becomes water soluble when exposed to actinic radiation.

6. The plate according to claim 1 further comprising a carrier sheet overlying and in releasible contact with the polymeric film.

7. A dry planographic printing plate comprising a substrate, and at least two additional layers disposed in superimposed relation to each other and both overlying the substrate,
   1. a silicone rubber layer adhesively bonded to at least one surface of the substrate; and
   2. overlying and adhesively bonded to the silicone rubber layer, a water soluble polymeric film having a diazo photosensitizer dispersed therein, said adhesive bond being formed by curing a layer of silicone gum while it is in physical contact with said substrate and said film.

8. The plate according to claim 7 wherein the diazo sensitizer is water soluble when unexposed and water insoluble when exposed to actinic radiation.

9. The plate according to claim 8 wherein the polymeric film is reacted upon by the exposed diazo sensitizer and thus becomes firmly boned to the sensitizer in the exposed image areas.

10. The plate according to claim 7 wherein the diazo sensitizer is water insoluble when unexposed and becomes water soluble when exposed to actinic radiation.

11. The plate according to claim 7 further comprising a carrier sheet overlying and in releasible contact with the polymeric film.

* * * * *

UNITED STATES PATENT OFFICE
CERTIFICATE OF CORRECTION

Patent No. 3,949,142                                     Dated  April 6, 1976

Inventor(s)  Towers Doggett

It is certified that error appears in the above-identified patent and that said Letters Patent are hereby corrected as shown below:

Column 1, line 19, between the words "Dry" and "silicone" insert --or--;
Column 1, line 33, the word "considerably" should be --considerable--;
Column 2, line 20, "toned-" should be --toned--;
Column 4, line 51, before the word "roll" insert a --,--;
Column 5, line 17, the word "through" should be --though--;

Column 14, line 36, the word "boned" should be --bonded--.

Signed and Sealed this

Twenty-seventh Day of December 1977

[SEAL]

Attest:

RUTH C. MASON  
Attesting Officer

LUTRELLE F. PARKER  
Acting Commissioner of Patents and Trademarks